US006507097B1

(12) United States Patent
Goetz et al.

(10) Patent No.: US 6,507,097 B1
(45) Date of Patent: Jan. 14, 2003

(54) HERMETIC PACKAGE FOR PYROELECTRIC-SENSITIVE ELECTRONIC DEVICE AND METHOD OF MANUFACTURING THE SAME

(75) Inventors: Martin P. Goetz, Dallas, TX (US); Merrill A. Hatcher, Garland, TX (US); Christopher E. Jones, Arlington, TX (US)

(73) Assignee: Clarisay, Inc., Dallas, TX (US)

( * ) Notice: Subject to any disclaimer, the term of this patent is extended or adjusted under 35 U.S.C. 154(b) by 0 days.

(21) Appl. No.: 09/997,860

(22) Filed: Nov. 29, 2001

(51) Int. Cl.$^7$ .............................................. H01L 23/02
(52) U.S. Cl. ........................................ 257/678; 257/415
(58) Field of Search ................................ 257/415, 678; 438/110, 51; 357/72; 310/313 R; 29/25.35

(56) References Cited

U.S. PATENT DOCUMENTS

| | | | |
|---|---|---|---|
| 4,920,801 A | | 5/1990 | Church |
| 5,117,279 A | * | 5/1992 | Karpman ...................... 357/72 |
| 5,235,135 A | | 8/1993 | Knecht et al. |
| 5,345,134 A | | 9/1994 | Greer |
| 5,453,652 A | * | 9/1995 | Eda et al. ................ 310/313 R |
| 5,699,027 A | | 12/1997 | Tsuji et al. |
| 5,896,636 A | | 4/1999 | Penunuri |
| 5,915,168 A | * | 6/1999 | Salatino et al. .............. 438/110 |
| 5,917,265 A | | 6/1999 | Naumenko et al. |
| 5,952,765 A | | 9/1999 | Garber et al. |
| 5,991,989 A | * | 11/1999 | Onishi et al. ............... 29/25.35 |
| 6,114,635 A | | 9/2000 | Lakin et al. |
| 6,146,917 A | * | 11/2000 | Zhang et al. .................. 438/51 |
| 6,181,015 B1 | | 1/2001 | Gotoh |
| 6,225,692 B1 | | 5/2001 | Hinds |
| 6,262,513 B1 | | 7/2001 | Furukawa |
| 6,321,444 B1 | | 11/2001 | Yatsuda et al. |

FOREIGN PATENT DOCUMENTS

JP        8-32402      2/1996

OTHER PUBLICATIONS

"Feasibility of Surface Activated Bonding for Ultra–fine Pitch Interconnection—a New Concept of Bump–less Direct Bonding for System Level Packaging" by T. Suga; 2000 IEEE; 4 pages.
"A Novel Temperature Compensation Method for SAW Devices Using Direct Bonding Techniques" by K. Onishi, A. Namba, H. Sato, T. Ogura, S. Seki, Y. Taguchi Y. Tomita, O. Kawasaki and K. Eda; 1997 IEEE; pp. 227–230.
"Silicon Wafer Bonding for MEMS Manufacturing" by A. A. Ayon; Solid State Technology Publication; Aug. 1999; 6 pages.
"Direct Bonding of Piezoelectric Materials Onto Si" by Kazuo Eda, Yoshihiro Tomita, Masato Sugimoto, Tetsuyoshi Ogura, Akihiko Nanba, Yutaka Taguchi and Osamu Kawasaki; 1996 IEEE; pp. 719–722.
"Si/Si Interface Bonded at Room Temperature by Ar Beam Surface Activation" by H. Takagi, R. Maeda, N. Hosoda and T. Suga; 1999; pp. 341–344.
"Even–Order Thickness–Shear Mode Resonators Using X–Cut Lita03 Plates Realized by a Direct Bonding Technique" by M. Sugimoto, K. Takeda, T. Ohtsuchi, Y. Tomita and O. Kawasaki 1998–IEEE; pp. 919–923.

* cited by examiner

Primary Examiner—David Nelms
Assistant Examiner—Thinh Nguyen

(57) ABSTRACT

A hermetic package for a pyroelectric-sensitive electronic device and methods of manufacturing one or more of such packages. In one embodiment, the package includes: (1) a device substrate having: (1a) an active region containing an electrically conductive pattern that constitutes at least a portion of the device and (1b) a bonding region surrounding the active region, (2) a non-porous mounting substrate having a bonding region thereon and (3) a nonmetallic hermetic sealing adhesive, located between the bonding region of the device substrate and the bonding region of the mounting substrate, that cures at a temperature substantially below a pyroelectric sensitive temperature of the device, the active region proximate a void between the device substrate and the mounting substrate.

21 Claims, 3 Drawing Sheets

HERMETIC PACKAGE FOR PYROELECTRIC-SENSITIVE ELECTRONIC DEVICE AND METHOD OF MANUFACTURING THE SAME

TECHNICAL FIELD OF THE INVENTION

The present invention is directed, in general, to surface acoustic wave circuits and, more specifically, to a hermetic package for a surface acoustic wave circuit and method of manufacturing such hermetic package therefor.

BACKGROUND OF THE INVENTION

Electronic signal processing by means of surface acoustic wave (SAW) devices has been widely adopted by the electronics industry. Such SAW devices can be designed to operate as analog electrical filters that operate at over a wide range of frequencies and have several advantages over conventional technologies. One such advantage is that they can be designed to provide complex signal processing in a single unit. Saw devices also benefit from the ability to be mass produced using semiconductor microfabrication techniques which produces highly uniform devices at a substantially reduced cost. SAW devices can be easily integrated into many digital communications systems and designed to operate in high harmonic modes in the gigahertz (GHz) frequency range.

The response characteristics of a particular SAW device are governed by several factors. One is the geometry of conductors laid out on the SAW resonator's piezoelectric substrate. A typical geometry for a SAW resonator includes first and second SAW finger sets. Portions of the finger sets are interdigitated in a central region of the SAW resonator and are employed to generate or attenuate acoustic waves. Additional non-interdigitated finger sets lie outside of the central region and serve to reflect acoustic waves back into the central region. Proper operation and containment of the acoustic waves require precise construction of both the central and outlying regions.

The interdigitated finger sets act as input and output signal ports when an AC voltage is applied to the signal input portion of the metal lines. Application of an appropriate input electrical AC signal provides the stimulus to create an acoustic wave that may typically be a Rayleigh wave with motion confined to about one acoustic wavelength under the free surface of the piezoelectric substrate. Alternatively, the acoustic excitation may be a "leaky wave," which also finds application in modern radio frequency devices. This wave is propagates to the receiver portion. The fingers corresponding to the signal receiving portion draw energy from the acoustic wave in the lattice and convert it into a filtered electrical signal.

However, effective operation at high frequencies and general reduction in device size require a SAW resonator with smaller, more closely spaced finger sets. An undesirable effect of these small geometries is that the metal lines become subject to failure. One particularly troublesome mechanism of failure resulting from formation of large voltage gradients in the piezoelectric substrate. Such voltage gradients may develop as a result of thermal gradients developed during heating cycles in the manufacturing process, given the inherent pyroelectric nature of the piezoelectric substrate. When the gradient exceeds a threshold, arcing may occur, damaging or destroying the ability of the interdigitated metal lines to transmit and detect the surface acoustic wave.

Accordingly, what is needed in the art is a surface acoustic wave device and a method of manufacturing a surface acoustic wave device that reduces or eliminates the damage to the device resulting from the presence of voltage gradients in the piezoelectric substrate.

SUMMARY OF THE INVENTION

To address the above-discussed deficiencies of the prior art, the present invention provides a hermetic package for a pyroelectric-sensitive electronic device and methods of manufacturing one or more of such packages. In one embodiment, the package includes: (1) a device substrate having: (1a) an active region containing an electrically conductive pattern that constitutes at least a portion of the device and (1b) a bonding region surrounding the active region, (2) a non-porous mounting substrate having a bonding region thereon and (3) a nonmetallic hermetic sealing adhesive, located between the bonding region of the device substrate and the bonding region of the mounting substrate, that cures at a temperature substantially below a pyroelectric sensitive temperature of the device, the active region proximate a void between the device substrate and the mounting substrate.

The present invention therefore introduces the broad concept of forming a hermetic seal for a pyroelectric-sensitive device of a nonmetallic sealing adhesive. Curing the adhesive involves relatively low temperatures, thereby avoiding any substantial pyroelectric effects that might harm the device.

In one embodiment of the present invention, the active region is sunken into the device substrate relative to the bonding region thereof to accommodate at least a portion of the void. In an alternative embodiment, a central region of the mounting substrate is sunken into the mounting substrate relative to the bonding region thereof to accommodate at least a portion of the void. In another alternative embodiment, both the device and mounting substrates have sunken portions that together accommodate the void.

In one embodiment of the present invention, the adhesive has a cure temperature of at most 150° Fahrenheit. Of course, other cure temperatures and ranges are within the broad scope of the present invention.

In one embodiment of the present invention, the device substrate comprises at least one selected from the group consisting of: (1) bismuth germanium oxide, (2) gallium arsenide, (3) lithium borate, (4) lithium niobate, (5) lithium tantalate, (6) langasite, (7) lead zirconium tantalate and (8) quartz. Those skilled in the art will understand, however, that other materials may be suitable for use as a device substrate, depending upon the particular application involved.

In one embodiment of the present invention, the mounting substrate comprises at least one selected from the group consisting of: (1) ceramic, (2) silicon and (3) glass. Those skilled in the art will understand, however, that other materials may be suitable for use as a mounting substrate, depending upon the particular application involved.

In one embodiment of the present invention, the adhesive comprises at least one selected from the group consisting of: (1) acrylate coated with silicon nitride, (2) acrylate coated with silicon carbide, (3) acrylate coated with silicon oxide, (4) acrylate coated with aluminum nitride, (5) acrylate coated with aluminum oxide, (6) benzocyclobutene coated with silicon nitride, (7) benzocyclobutene coated with silicon carbide, (8) benzocyclobutene coated with silicon oxide, (9) benzocyclobutene coated with aluminum nitride, (10)

benzocyclobutene coated with aluminum oxide and (11) epoxy resin. Those skilled in the art will understand, however, that other materials may be suitable for use as an adhesive, depending upon the particular application involved.

In one embodiment of the present invention, the device is selected from the group consisting of: (1) a surface acoustic wave device, (2) a micro-electromechanical system device, (3) a mirror device and (4) a piezoelectric device. Those skilled in the art will understand, however, that other devices are within the broad scope of the present invention.

In one embodiment of the present invention, the device substrate and the mounting substrate have coextensive footprints. Noncoextensive footprints are within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1B:
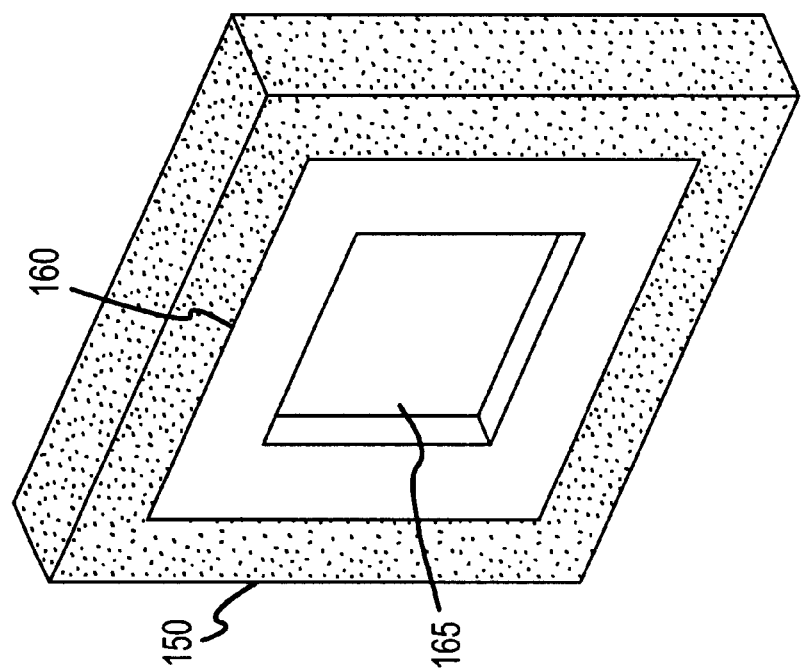
FIG. 1B illustrates the mounting substrate 150 illustrated in FIG. 1A.
Figure 1A:
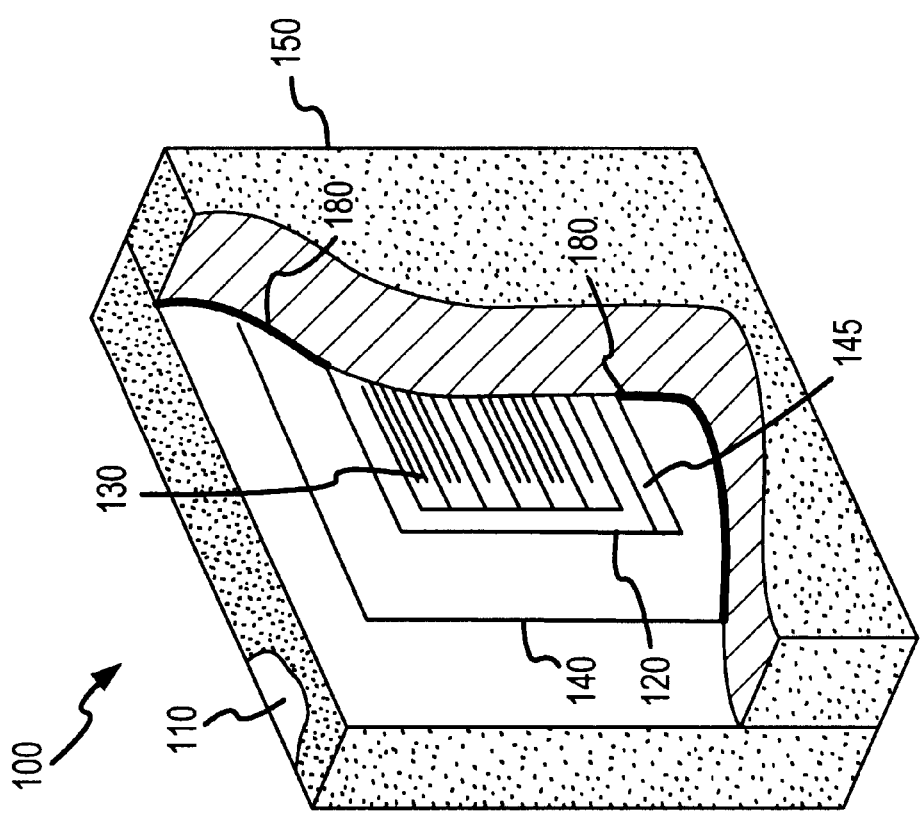
FIG. 1A illustrates a hermetic package for a pyroelectric-sensitive electronic device constructed according to the principles of the present invention, the illustration depicting a portion of a mounting substrate 150 removed for clarity.

Referring initially to FIGS. 1A and 1B, illustrated are a pyroelectric-sensitive electronic device hermetic package 100 and a mounting substrate 150 included therein. The package 100 includes a device substrate 110, the non-porous mounting substrate 150 and a nonmetallic hermetic sealing adhesive 180.

The device substrate 110 may comprise at least one selected from the group consisting of bismuth germanium oxide, gallium arsenide, lithium borate, lithium niobate, lithium tantalate, langasite, lead zirconium tantalate, and quartz. Those skilled in the art will understand, however, that other materials may be suitable for use as the 110 device substrate, depending upon the particular application involved. The device substrate 110 includes an active region 120, containing an electrically conductive pattern 130 that constitutes at least a portion of a pyro-sensitive electronic device, and a bonding region 140 surrounding the active region 120. In the illustrated embodiment, the active region 120 is located within a void formed by a recess 145 in the bonding region 140, the active region 120 thereby sunken into the device substrate 110 relative to the bonding region 140. However, it should be understood by those skilled in the art that while the void formed by the recess 145 in bonding region 140 is desirable in some applications, the active region 120 and the electrically conductive pattern 130 contained therein may also be located directly on the surface of the device substrate 110 comprising the bonding region 140, such an alternative embodiment thus excluding the recess 145.

The non-porous mounting substrate 150, which may comprise ceramic, silicon or glass, includes a bonding region 160 thereon, a footprint of the bonding region 160 at least partially conforming to a footprint of the bonding region 140. In the illustrated embodiment, a footprint of the mounting substrate 150 is coextensive with a footprint of the device substrate 110. However, it should be understood by those skilled in the art that some applications will not require such coextensiveness. In the illustrated embodiment, the mounting substrate 150 includes a void formed by a recess 165 in a central region of the bonding region 160, the central region thereby sunken into the mounting substrate 150 relative to the bonding region 160. While in the illustrated embodiment a void is formed by both the recess 145 and the recess 165, some applications won't include the recess 165 formed in the bonding region 160. However, those skilled in the art will understand that either the recess 165 or the recess 145 is necessary to form the void proximate the active region 120 containing the electrically conductive pattern 130.

The nonmetallic hermetic sealing adhesive 180 is located between the device substrate 110 and the mounting substrate 150 and adheres the two bonding regions 140, 160 to one another. The bonding of the two bonding regions 140, 160 creates a hermetic seal around the active area 120 and the electrically conductive pattern 130 contained therein. In one embodiment, the void formed by the recesses 145, 165 is evacuated prior to adhering the bonding surfaces 140, 160, such that the void contains a vacuum upon sealing. By evacuating the void and subsequently sealing the void by means of the hermetic seal created by the hermetic sealing adhesive 180, operation of the electronic device partially formed by the electrically conductive pattern 180 will not be disturbed or otherwise influenced by unwanted solids, liquids, particulate or other contaminants. In this manner, an unpassivated, pyroelectric-sensitive and contact-sensitive electronic device may nonetheless be protected to ensure predictable performance.

In one embodiment, the nonmetallic hermetic sealing adhesive comprises a material having a cure temperature substantially below a pyroelectric sensitive temperature of the electronic device at least partially formed by the electrically conductive pattern 130. The pyroelectric sensitive temperature is that temperature at which thermal gradients within the device substrate 110 generate corresponding voltage gradients sufficient for arcing to occur across the electrically conductive pattern 130, thereby damaging or destroying the device at least partially formed by the electrically conductive pattern 130. It is known to those skilled in the art that the adhesive 180 may therefore comprise material having a cure temperature of at most 150° Fahrenheit. Of course, other cure temperatures and ranges are within the broad scope of the present invention.

By curing the adhesive 180 at a temperature below the pyroelectric sensitive temperature of the electronic device, voltage gradients driven by thermal gradients in the pyroelectric material are prevented from developing and subsequently damaging or destroying the ability of the interdigitated metal lines forming the electrically conductive pattern 130 to transmit and detect a surface acoustic wave. The adhesive 180 may comprise acrylate, benzocyclobutene or epoxy coated with at least one selected from the group consisting of silicon nitride, silicon carbide, silicon oxide, aluminum nitride and aluminum oxide. Those skilled in the art will understand, however, that other materials may be suitable for use as the adhesive 180, depending upon the particular application involved.

In the illustrated embodiment, the electrically conductive pattern 130 may comprise SAW conductors. Such SAW conductors may cooperate to form multiple SAW resonators or other typical SAW circuits. Those skilled in the art should recognize that the conductive pattern 130 is not limited by the scope of the present invention to SAW applications, and that the architecture of the package 100 is equally beneficial to applications calling for other piezoelectric, MEMS or mirror devices that would benefit from the hermetic passivation and pyro-electric sensitivity ensured by this architecture.

Figure 2:
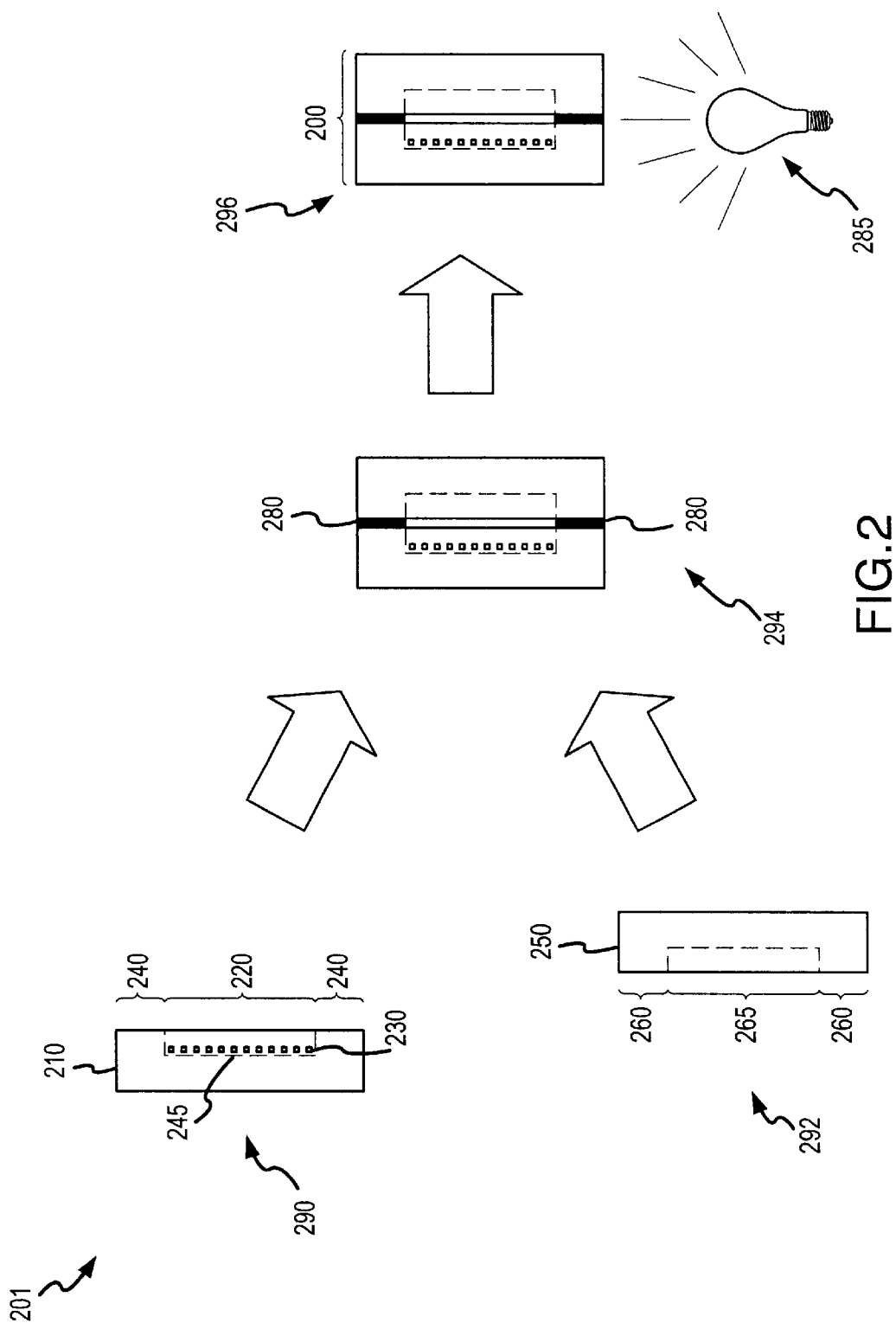
FIG. 2 illustrates a method of manufacturing a hermetic package for a pyroelectric-sensitive electronic device according to the principles of the present invention.

Turning now to FIG. 2, illustrated is a method 201 of manufacturing an embodiment of a pyroelectric-sensitive electronic device hermetic package 200, which in the present embodiment may be similar to the package 100 illustrated in FIG. 1A. The method 201 begins at a step 290, wherein a device substrate 210 is provided. The device substrate 210 may comprise at least one selected from the group consisting of bismuth germanium oxide, gallium arsenide, lithium borate, lithium niobate, lithium tantalate, langasite, lead zirconium tantalate, and quartz. Those skilled in the art will understand, however, that other materials may be suitable for use as the device substrate 210, depending upon the particular application involved.

The device substrate 210 includes an active region 220, containing an electrically conductive pattern 230 that constitutes at least a portion of a pyro-sensitive electronic device, and a bonding region 240 surrounding the active region 220. In the illustrated embodiment, the active region 220 is located within a void formed by a recess 245 in the bonding region 240, the active region 220 thereby sunken into the device substrate 210 relative to the bonding region 240. However, it should be understood by those skilled in the art that while the void formed by the recess 245 in bonding region 240 is desirable in some applications, the active region 220 and the electrically conductive pattern 230 contained therein may also be located directly on the surface of the device substrate 210 comprising the bonding region 240, such an alternative embodiment thus excluding the recess 245.

In a step 292, a non-porous mounting substrate 250 is formed. The mounting substrate 250, which may comprise ceramic and/or silicon, includes a bonding region 260 thereon, a footprint of the bonding region 260 at least partially conforming to a footprint of the bonding region 240. In the illustrated embodiment, a footprint of the mounting substrate 250 is substantially coextensive with a footprint of the device substrate 110. However, it should be understood by those skilled in the art that some applications will not require such coextensiveness. In the illustrated embodiment, mounting substrate 250 includes a void formed by a recess 265 in a central region of the bonding region 260, the central region thereby sunken into the mounting substrate 250 relative to the bonding region 260. While in the illustrated embodiment the void is formed by both the recess 245 and the recess 265, some applications won't include the recess 265 formed in the bonding region 260. However, those skilled in the art will understand that either the recess 265 or the recess 245 is necessary to form the void proximate the active region 220 containing the electrically conductive pattern 230.

In a step 294, a nonmetallic hermetic sealing adhesive 280 is located between the device substrate 210 and the mounting substrate 250 and adheres the two bonding regions 240, 260 to one another. The bonding of the two bonding regions 240, 260 creates a hermetic seal around the active area 220 and the electrically conductive pattern 230 contained therein. In one embodiment, the void formed by the recesses 245, 265 is evacuated prior to adhering the bonding surfaces 240, 260, such that the void contains a vacuum upon sealing. By evacuating the void and subsequently sealing the void by means of the hermetic seal created by the hermetic sealing adhesive 280, operation of the electronic device partially formed by the electrically conductive pattern 280 will not be disturbed or otherwise influenced by unwanted solids, liquids, particulate or other contaminants. In this manner, an unpassivated, pyroelectric-sensitive and contact-sensitive electronic device may nonetheless be protected to ensure predictable performance.

In a final step 296, a heat source 285 is employed to cure the adhesive 280. Those skilled in the art should understand the heat sources conventionally available for curing the adhesive 280. In one embodiment, the nonmetallic hermetic sealing adhesive comprises a material having a cure temperature substantially below a pyroelectric sensitive temperature of the electronic device at least partially formed by the electrically conductive pattern 230. It is known to those skilled in the art that the adhesive 280 may therefore comprise material having a cure temperature of at most 150° Fahrenheit. Of course, other cure temperatures and ranges are within the broad scope of the present invention.

By curing the adhesive 280 at a temperature below the pyroelectric sensitive temperature of the electronic device, voltage gradients driven by thermal gradients in the pyroelectric material are prevented from developing and subsequently damaging or destroying the ability of the interdigitated metal lines forming the electrically conductive pattern 230 to transmit and detect a surface acoustic wave. The adhesive 280 may comprise acrylate, epoxy or benzocyclobutene coated with at least one selected from the group consisting of silicon nitride, silicon carbide, silicon oxide, aluminum nitride and aluminum oxide. Those skilled in the art will understand, however, that other materials may be suitable for use as the adhesive 280, depending upon the particular application involved.

In the illustrated embodiment, the electrically conductive pattern 230 may comprise SAW conductors. Such SAW conductors may cooperate to form multiple SAW resonators or other typical SAW circuits. Those skilled in the art should recognize that the conductive pattern 230 is not limited by the scope of the present invention to SAW applications, and that the architecture of the package 200 is equally beneficial to applications calling for other piezoelectric, MEMS or mirror devices that would benefit from the hermetic passivation and pyro-electric sensitivity ensured by this architecture.

Figure 3:
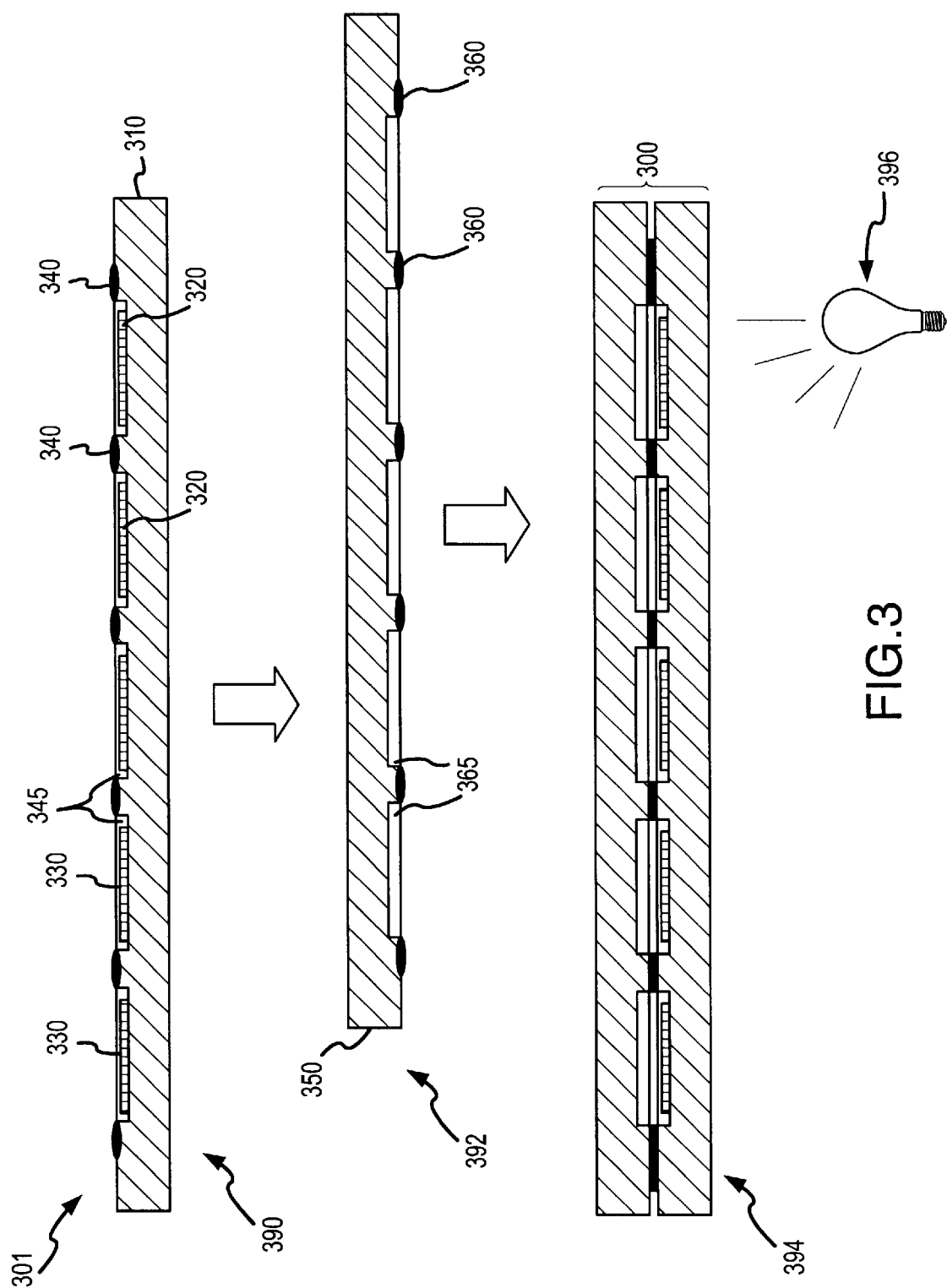
FIG. 3 illustrates method of manufacturing a hermetic package for a plurality of pyroelectric-sensitive electronic devices.

Turning now to FIG. 3, illustrated is a method 301 of manufacturing an embodiment of a hermetic package 300 comprising a plurality of pyroelectric-sensitive SAW devices 330. The method 301 begins at a step 390, wherein a plurality of SAW devices 330 is arranged on a device substrate wafer 310. The device substrate wafer 310 may comprise at least one selected from the group consisting of bismuth germanium oxide, gallium arsenide, lithium borate, lithium niobate, lithium tantalate, langasite, lead zirconium tantalate, and quartz. Those skilled in the art will understand, however, that other materials may be suitable for use as the device substrate 310 depending upon the particular application involved.

The device substrate wafer 310 includes a plurality of active regions 320, each of the plurality of active regions 320 containing an electrically conductive pattern 330 that constitutes at least a portion of a pyro-sensitive SAW device, and a plurality of bonding regions 340, each of the plurality of bonding regions 340 surrounding a corresponding active region 320. In the illustrated embodiment, each of the plurality of active regions 320 is located within a corresponding one of a plurality of voids each formed by a recess 345 in one of the plurality of bonding regions 340. Each active region 320 is thereby sunken into the device substrate wafer 310 relative to a corresponding bonding region 340. However, it should be understood by those skilled in the art that while the plurality of voids formed by the plurality of recesses 345 in the plurality of bonding regions 340 is desirable in some applications, the plurality of active regions 320 and the plurality of electrically conductive patterns 330 contained therein may also be located on the surface of the device substrate wafer 310 comprising the plurality of bonding regions 340, such an alternative embodiment thus excluding the plurality of recesses 345.

In a step 392, a non-porous mounting substrate 350 is formed. The mounting substrate 350, which may comprise ceramic, silicon or glass, includes a plurality of bonding regions 360 thereon, a footprint of each of the plurality of bonding regions 360 at least partially conforming to a footprint a corresponding one of the plurality of the bonding regions 340. In the illustrated embodiment, the mounting substrate 350 includes a plurality of voids each formed by one of a plurality of recesses 365 in a central region of a corresponding one of the plurality of bonding regions 360, each central region thereby sunken into the mounting substrate 350 relative to the corresponding bonding region 360. While in the illustrated embodiment each of the plurality of voids is formed by both a recess 345 and a recess 365, some applications won't include a recess 365 formed in a bonding region 360. However, those skilled in the art will understand that either a recess 365 or a recess 345 is necessary to form the void proximate an active region 320 containing an electrically conductive pattern 330.

In a step 394, a nonmetallic hermetic sealing adhesive 380 is introduced between the device substrate wafer 310 and the mounting substrate 350 and adheres a corresponding pair of bonding regions 340, 360 to one another. The bonding of the two bonding regions 340, 360 creates a hermetic seal around the corresponding active area 320 and the electrically conductive pattern 330 contained therein. In one embodiment, each of the plurality of voids formed by the recesses 345, 365 is evacuated prior to adhering the corresponding pair of bonding surfaces 340, 360, such that each void contains a vacuum upon sealing. By evacuating the plurality of voids and subsequently sealing the voids by means of the hermetic seal created by the hermetic sealing adhesive 380, operation of each of the SAW devices partially formed by the plurality of electrically conductive patterns 380 will not be disturbed or otherwise influenced by unwanted solids, liquids, particulate or other contaminants. In this manner, a plurality of unpassivated, pyroelectric-sensitive and contact-sensitive SAW devices may nonetheless be protected to ensure predictable performance.

In a final step 396, a heat source 385 is employed to cure the adhesive 380. Those skilled in the art should understand the heat sources conventionally available for curing the adhesive 380. In one embodiment, the nonmetallic hermetic sealing adhesive comprises a material having a cure temperature substantially below a pyroelectric sensitive temperature of the plurality of SAW devices at least partially formed by the plurality of electrically conductive patterns 330. It is known to those skilled in the art that the adhesive 380 may therefore comprise material having a cure temperature of at most 150° Fahrenheit. Of course, other cure temperatures and ranges are within the broad scope of the present invention.

By curing the adhesive 380 at a temperature below the pyroelectric sensitive temperature of the plurality of electronic devices, voltage gradients driven by thermal gradients in the pyroelectric material are prevented from developing and subsequently damaging or destroying the ability of the interdigitated metal lines forming the plurality of electrically conductive patterns 330 to transmit and detect a surface acoustic wave. The adhesive 380 may comprise acrylate, epoxy or benzocyclobutene coated with at least one selected from the group consisting of silicon nitride, silicon carbide, silicon oxide, aluminum nitride and aluminum oxide. Those skilled in the art will understand, however, that other materials may be suitable for use as an adhesive, depending upon the particular application involved.

Method 301 may include an additional step (not shown), wherein a passivation layer is formed over at least a portion of the mounting substrate 350, spanning the mounting substrate 350 and the device substrate wafer 310. The passivation layer is primarily employed to resolve any mechanical or handling issues that may arise. By protecting the package 300 with the passivation layer, the threat of damage encountered in subsequent manual or automated handling and assembly procedures (e.g., pick-and-place procedures) may be mitigated. The passivation layer may comprise bismuth germanium oxide, gallium arsenide, lithium borate, lithium niobate, lithium tantalate, langasite, lead zirconium tantalate, quartz, ceramic, silicon, Pyrex or any other similar material or a combination thereof. The passivation layer may be applied to the package 300 either by injection, transfer molding or liquid disposition.

In the illustrated embodiment, the electrically conductive pattern 330 may comprise SAW conductors. Such SAW conductors may cooperate to form multiple SAW resonators or other typical SAW circuits. Those skilled in the art should recognize that each of the plurality of conductive patterns 330 is not limited by the scope of the present invention to SAW applications, and that the architecture of the package 300 is equally beneficial to applications calling for other piezoelectric, MEMS or mirror devices that would benefit from the hermetic passivation and pyroelectric sensitivity ensured by this architecture.

The manufacturing method 301 may also include a step (not shown) in which the packaged hermetic wafer assembly 300 may be separated into individual hermetic packages (not shown, but similar to the hermetic package 200 discussed in reference to FIG. 2), each package containing one or more electronic devices. In an exemplary embodiment, the hermetic wafer assembly 302 may be separated into the individual hermetic packages using wafer dicing, however, one skilled in the art understands that any compatible separation technique may be used.

Although the present invention has been described in detail, those skilled in the art should understand that they can make various changes, substitutions and alterations herein without departing from the spirit and scope of the invention in its broadest form.

What is claimed is:

1. A hermetic package for a pyroelectric-sensitive electronic device, comprising:
   a device substrate having:
      an active region containing an electrically conductive pattern that constitutes at least a portion of said device, and
      a bonding region surrounding said active region;
   a non-porous mounting substrate having a bonding region thereon; and
   a nonmetallic hermetic sealing adhesive, located between said bonding region of said device substrate and said bonding region of said mounting substrate, that cures at a temperature substantially below a pyroelectric sensitive temperature of said device, said active region proximate a void between said device substrate and said mounting substrate.

2. The package as recited in claim 1 wherein said active region is sunken into said device substrate relative to said bonding region thereof to accommodate at least a portion of said void.

3. The package as recited in claim 1 wherein a central region of said mounting substrate is sunken into said mounting substrate relative to said bonding region thereof to accommodate at least a portion of said void.

4. The package as recited in claim 1 wherein said adhesive has a cure temperature of at most 150° Fahrenheit.

5. The package as recited in claim 1 wherein said device substrate comprises at least one selected from the group consisting of:
   bismuth germanium oxide,
   gallium arsenide,
   lithium borate,
   lithium niobate,
   lithium tantalate,
   langasite,
   lead zirconium tantalate, and
   quartz.

6. The package as recited in claim 1 wherein said mounting substrate comprises at least one selected from the group consisting of:
   ceramic,
   glass, and
   silicon.

7. The package as recited in claim 1 wherein said adhesive comprises one selected from the group consisting of:
   acrylate,
   epoxy, and
   benzocyclobutene.

8. The package as recited in claim 7 wherein said one is coated with a coating selected from the group consisting of:
   silicon nitride,
   silicon carbide,
   silicon oxide,
   aluminum nitride, and
   aluminum oxide.

9. The package as recited in claim 1 wherein said device is selected from the group consisting of:
   a surface acoustic wave device,
   a micro-electromechanical system device,
   a mirror device, and
   a piezoelectric device.

10. The package as recited in claim 1 wherein said device substrate and said mounting substrate have coextensive footprints.

11. A method of manufacturing a hermetic package for a pyroelectric-sensitive electronic device, comprising:
   forming a device substrate having:
      an active region containing an electrically conductive pattern that constitutes at least a portion of said device, and
      a bonding region surrounding said active region;
   forming a non-porous mounting substrate having a bonding region thereon;
   introducing a nonmetallic hermetic sealing adhesive between said bonding region of said device substrate and said bonding region of said mounting substrate; and
   curing said sealing adhesive at a temperature substantially below a pyroelectric sensitive temperature of said device, said active region proximate a void between said device substrate and said mounting substrate.

12. The method as recited in claim 11 wherein said forming said device substrate comprises sinking said active region into said device substrate relative to said bonding region thereof to accommodate at least a portion of said void.

13. The method as recited in claim 11 wherein said forming said mounting substrate comprises sinking a central region of said mounting substrate into said mounting substrate relative to said bonding region thereof to accommodate at least a portion of said void.

14. The method as recited in claim 11 wherein said introducing further comprises introducing an adhesive having a cure temperature of at most 150° Fahrenheit.

15. The method as recited in claim 11 wherein said forming said device substrate comprises forming a device substrate comprising at least one selected from the group consisting of:
   bismuth germanium oxide,
   gallium arsenide,
   lithium borate,
   lithium niobate,
   lithium tantalate,
   langasite,
   lead zirconium tantalate, and
   quartz.

16. The method as recited in claim 11 wherein said forming said non-porous mounting substrate comprises forming a mounting substrate comprising at least one selected from the group consisting of:
   ceramic,
   glass, and
   silicon.

17. The method as recited in claim 11 wherein said introducing said adhesive comprises introducing an adhesive comprising one selected from the group consisting of:
   acrylate,
   epoxy, and
   benzocyclobutene.

18. The method as recited in claim 17 wherein said one is coated with a coating selected from the group consisting of:
   silicon nitride,
   silicon carbide,
   silicon oxide,
   aluminum nitride, and
   aluminum oxide.

19. The method as recited in claim 11 wherein said device is selected from the group consisting of:
   a surface acoustic wave device,
   a micro-electromechanical system device,
   a mirror device, and
   a piezoelectric device.

20. The method as recited in claim 11 wherein said device substrate and said mounting substrate have coextensive footprints.

21. A method of manufacturing a hermetic package for a plurality of surface acoustic wave (SAW) devices, comprising:

arranging said plurality of SAW devices on a device substrate wafer such that active regions thereof are surrounded by bonding regions;

forming a non-porous mounting substrate having bonding regions thereon that correspond to said bonding regions of said device substrate wafer;

introducing a nonmetallic hermetic sealing adhesive between said bonding regions of said device substrate wafer and said bonding regions of said mounting substrate; and curing said sealing adhesive at a temperature substantially below a pyroelectric sensitive temperature of said SAW devices, said active regions thereof proximate voids between said device substrate wafer and said mounting substrate.

* * * * *